United States Patent [19]

Shamble

[11] Patent Number: 5,044,750

[45] Date of Patent: Sep. 3, 1991

[54] METHOD FOR CHECKING LITHOGRAPHY CRITICAL DIMENSIONS

[75] Inventor: Edward M. Shamble, Milpitas, Calif.

[73] Assignee: National Semiconductor Corporation, Santa Clara, Calif.

[21] Appl. No.: 566,561

[22] Filed: Aug. 13, 1990

[51] Int. Cl.[5] .................. G01B 11/00; G03C 5/00; G03B 27/32

[52] U.S. Cl. .................. 356/372; 324/158 R; 355/55; 355/77; 356/401; 430/30

[58] Field of Search .................. 356/372, 401, 384; 355/53, 77; 430/30; 324/158 R

[56] References Cited

U.S. PATENT DOCUMENTS

| | | | |
|---|---|---|---|
| 3,974,443 | 8/1976 | Thomas | 324/64 |
| 4,200,396 | 4/1980 | Kleinknecht et al. | 356/384 |
| 4,347,479 | 8/1982 | Cullet | 324/64 |
| 4,399,205 | 8/1983 | Bergendahl | 430/30 |
| 4,566,192 | 1/1986 | Hankins et al. | 33/1 B |
| 4,639,142 | 1/1987 | Chow et al. | 356/372 |
| 4,672,314 | 6/1987 | Kokkas | 324/158 |
| 4,717,445 | 1/1988 | Leung | 156/626 |
| 4,806,457 | 2/1989 | Yanagisawa | 430/30 |
| 4,908,656 | 3/1990 | Suwa et al. | 355/77 |
| 4,963,924 | 10/1990 | Gill et al. | 355/77 |

FOREIGN PATENT DOCUMENTS

| | | | |
|---|---|---|---|
| 278018 | 11/1989 | Japan | 430/30 |
| 46462 | 2/1990 | Japan | 430/30 |

OTHER PUBLICATIONS

Murray, "Measuring Dimensions Using Murray Dagger", *Semiconductor International*, Dec. 1982.

Primary Examiner—F. L. Evans
Attorney, Agent, or Firm—Limbach, Limbach & Sutton

[57] ABSTRACT

A method for measuring the proper exposure and registration of layers of desired circuit features on an integrated circuit wafer. The process of making the integrated circuit feature is modified in three ways. First, a structure is added to the mask pattern for each layer, apart from the desired circuit feature and parallel with and abutting the previous layer structure, comprising a plurality of geometric patterns arranged in a progressively overlapping edge-to-edge orientation on the mask pattern. The progressive overlap is such that at one end of the structure there is a substantial separation between the opposing edges of the geometric patterns, in the middle of the structure the opposing edges of the geometric patterns meet, and at the other end of the structure there is a substantial overlap of the opposing edges of the geometric patterns. The non-opposing edges of the geometric patterns are offset relative to a reference pattern in the middle of the structure. Second, the degree of exposure of the structure on a photoresist layer is analyzed. The proper degree of exposure is obtained when the opposing edges of each geometric pattern meet in the middle of the structure, an underexposed or overexposed condition exists when the point at which the opposing edges meet has shifted from the middle of the structure. Third, the registration of succeeding layers of features is analyzed. Proper registration is obtained when the abutting, non-opposing edges of the parallel structures of each layer meet at the reference pattern.

10 Claims, 5 Drawing Sheets

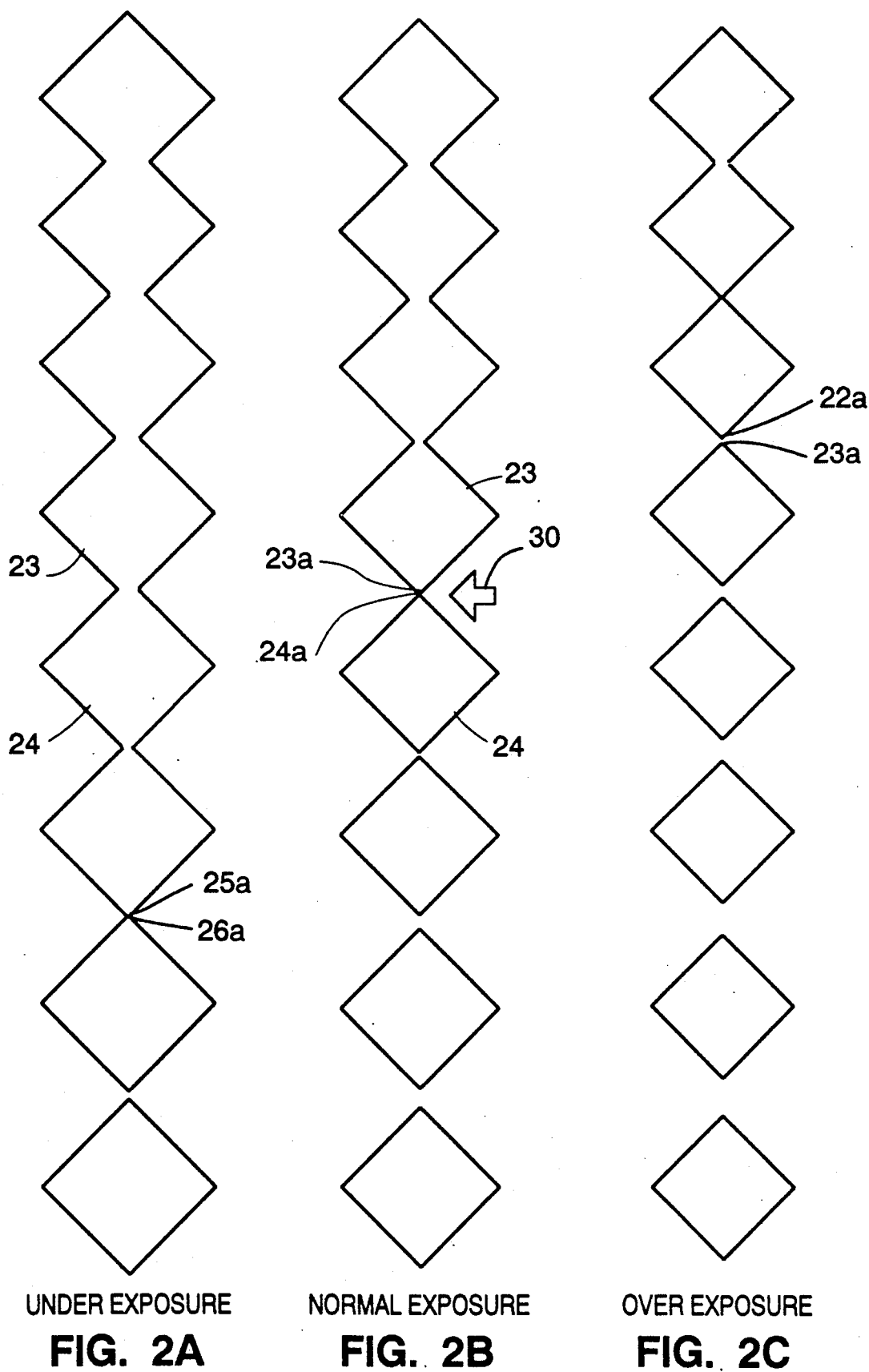

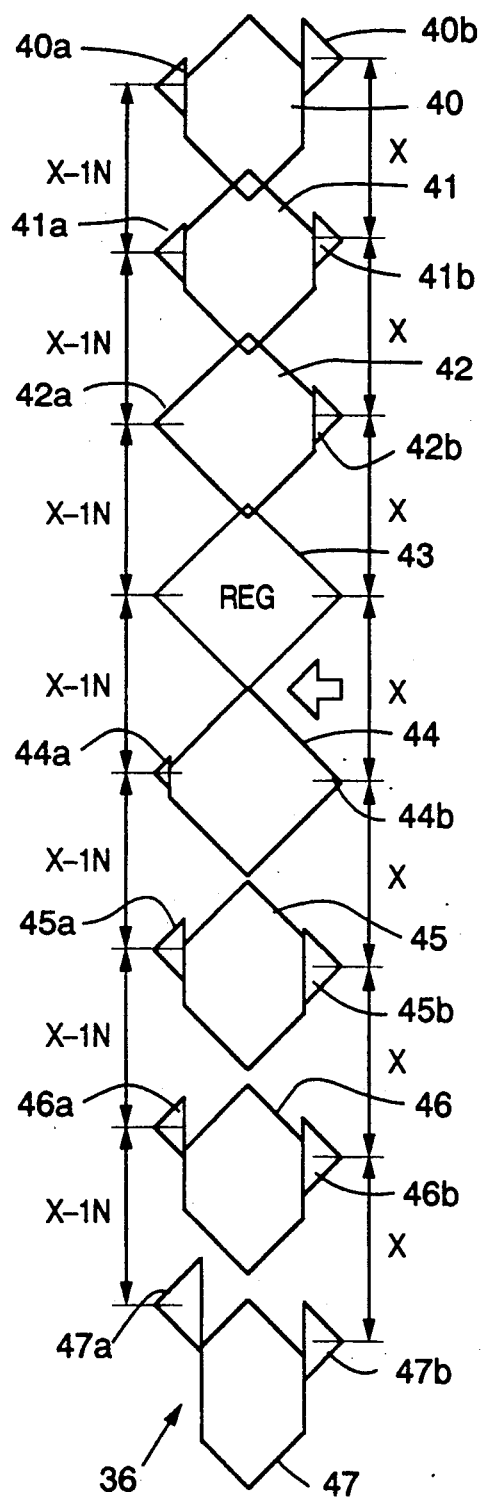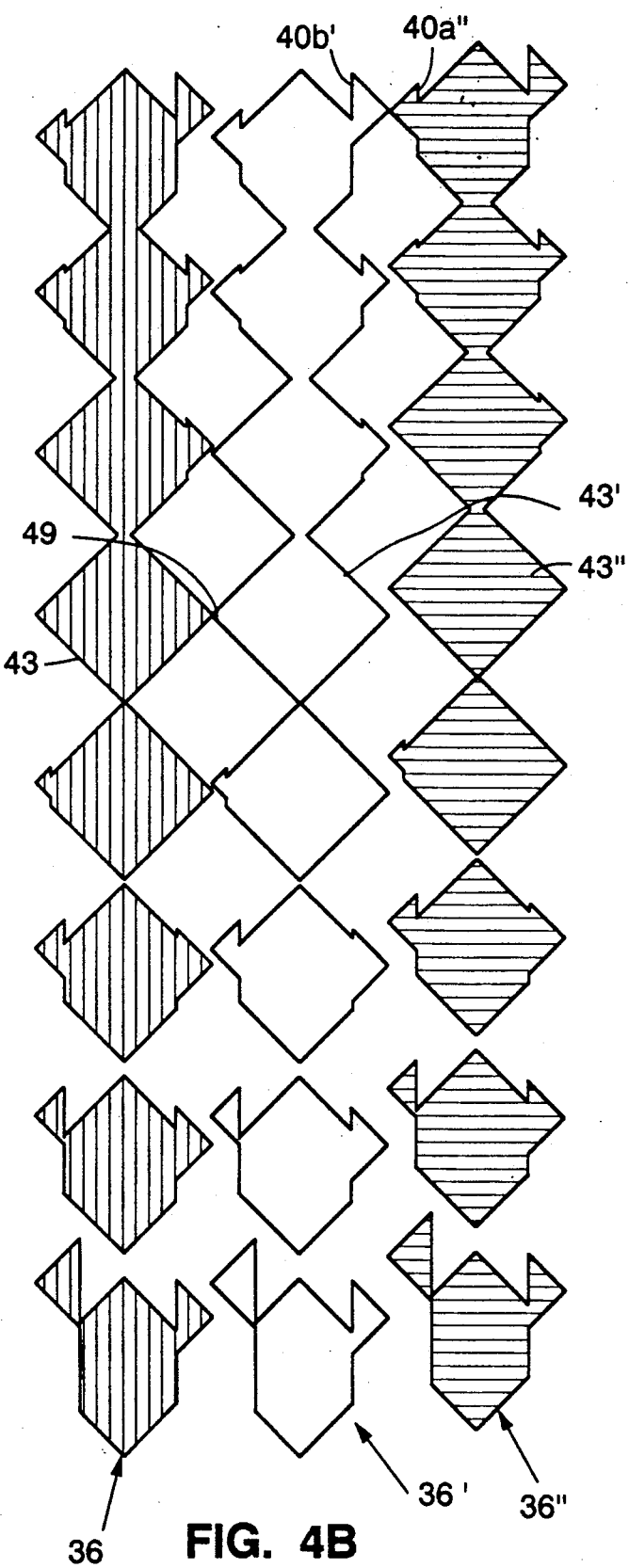
FIG. 4A  FIG. 4B

METHOD FOR CHECKING LITHOGRAPHY CRITICAL DIMENSIONS

BACKGROUND

1. Field of the Invention

The present invention relates to fabrication of integrated circuits and, in particular, to structure and methods for verifying photolithographic exposure during integrated circuit fabrication.

2. Discussion of the Prior Art

As is well known, photolithographic techniques are utilized in the fabrication of integrated circuits to define the extremely small geometries required in such circuits. A basic step in the photolithographic fabrication of integrated circuits involves coating a substrate, usually silicon, with a thin layer of photosensitive material called photoresist or simply resist. The integrated circuit geometric feature which is desired to be created in the substrate is transferred to the photoresist from a pattern on a glass plate or "mask" by any one of a variety of well known optical exposure techniques. The transferred pattern is then etched onto the photoresist using a solvent to remove the exposed portions, revealing corresponding portions of the underlying substrate. These exposed portions of the substrate may then be processed. For example, active dopant atoms can be introduced to selected region of the substrate to alter the electrical characteristics of these regions, or the underlying insulating or conductive layers may be etched. The process is then repeated for as many layers as are required to fabricate the desired circuit.

One of the problems associated with the exposure process is the possibility of under- or over-exposure of the photoresist. This can cause incomplete transfer of the pattern or inaccurate line widths, causing reliability or functionality problems One solution to the problem is to incorporate a line on the mask pattern, separate and apart from the integrated circuit feature This so-called "critical dimension line is then microscopically examined after exposure of the photoresist. The width of the line provides information regarding the degree of exposure. Obtaining a measurement equal to the expected line width means that proper exposure has been obtained. If the line is thinner than expected, an overexposed condition exists. If the line is broader than expected, an underexposed condition exists.

An ancillary problem in measuring the critical dimension line width is that high powered microscopes are often required. Such microscopes are expensive and not always readily available for on-the-spot measurement during a circuit fabrication process, or if they are available, there is a high demand for its use such that delays in measurement often occur.

Another problem in the fabrication process is the difficulty obtaining registration of successive layers of circuit features. As successive layers are fabricated, different masks are used to create the desired circuit features. In order to function properly, the circuit features of each layer must be vertically aligned in order to accurately interconnect, or separate, as appropriate, the added portion of exposed resist Therefore, it would be desirable to provide an improved method for verifying the proper exposure of a photoresist pattern on a silicon wafer during integrated circuit fabrication. Such a method should quickly and efficiently check the critical dimensions of integrated circuit features as transferred by lithography.

It would also be desirable to provide a method for verifying registration of successive layers of exposed features on the same structure as is used for critical dimension verification to save space on the wafer and speed inspection time.

SUMMARY OF THE INVENTION

The present invention provides a method for measuring the proper exposure of a desired circuit feature on an exposed integrated circuit wafer. The conventional process of making an integrated circuit feature comprises (1) forming a layer of photoresist on a silicon substrate, (2) creating a mask pattern of the desired circuit feature, (3) transferring the mask pattern to the photoresist layer, (4) exposing the photo-resist layer using photochemical means and (5) transferring the pattern to the underlying surface. In accordance with the invention, the conventional method is modified in two ways. First, a structure is added to the mask pattern, separate and apart from the desired circuit feature, comprising a plurality of geometric patterns arranged in a progressively overlapping edge-to-edge orientation on the mask pattern. The progressive overlap is such that at one end of the structure there is a substantial separation between the opposing edges of the geometric patterns, in the middle of the structure the opposing edges of the geometric patterns meet, and at the other end of the structure there is a substantial overlap of the opposing edges of the geometric patterns. Second, the degree of exposure of the structure as transferred onto the photoresist layer is analyzed. The proper degree of exposure is obtained when the opposing edges of the geometric pattern meet in the middle of the structure. An underexposed or overexposed condition exists when the point of meeting of the opposing edges has shifted from the middle of the structure.

It may be desirable in some conditions to specify a degree of under or over exposure. This can be easily accomplished by specifying the point of meeting of the opposing edges.

In an alternative embodiment, the method is modified to add a structure to the mask pattern for each layer, separate and apart from the desired circuit feature and parallel with and abutting the previous layer structure. The structure comprises a plurality of geometric patterns arranged in a progressively overlapping edge-to-edge orientation on the mask pattern, the progressive overlap being such that at one end of the structure there is a substantial separation between the opposing edges of the geometric patterns, in the middle of the structure the opposing edges of the geometric patterns meet, and at the other end of the structure there is a substantial overlap of the opposing edges of the geometric patterns. The non-opposing edges of the geometric patterns are offset relative to a reference pattern in the middle of the structure. The degree of exposure of the structure on the photoresist layer is then analyzed. The proper degree of exposure is obtained when the opposing edges of each geometric pattern meet in the middle of the structure. An underexposed or overexposed condition exists when the point of meeting of the opposing edges has shifted from center. Then, the registration of succeeding layers of features is analyzed. The proper registration is obtained when the abutting, non-opposing edges of the exposed parallel structures of adjacent layers meet at the reference pattern. The nature and degree of an off-registration condition may be determined by reference to which abutting, parallel geometric patterns have their offset, non-opposing edges meeting.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIGS. 2A-2C illustrate the structure of FIG. 1 for varying degrees of exposure.

FIGS. 4A-4B illustrate the use of a structure on a photolithographic mask pattern for checking the critical dimension and registration of successive layers of integrated circuit features during fabrication according to the present invention.

DETAILED DESCRIPTION OF THE INVENTION

Figure 1A:
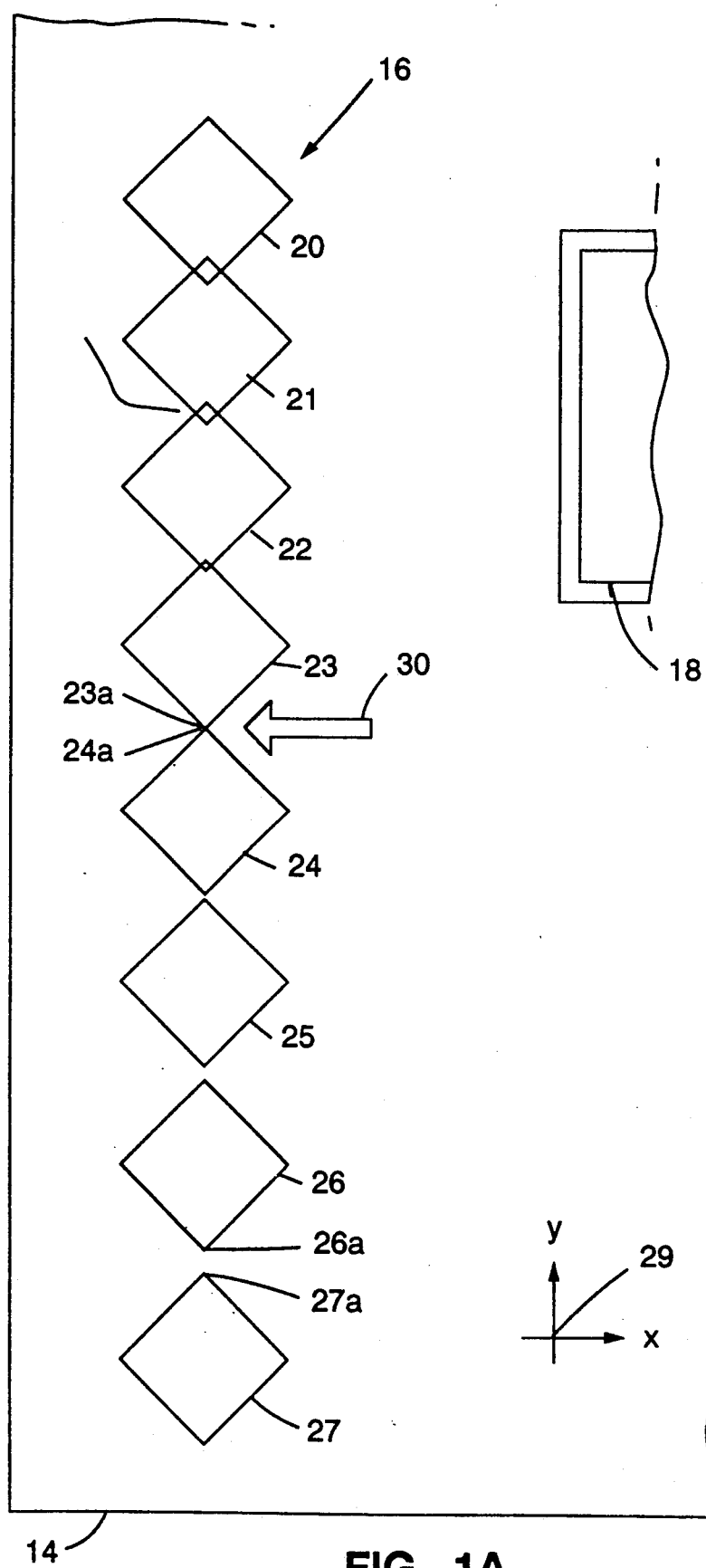
FIGS. 1A and 1B illustrate a structure on a photolithographic mask pattern for checking the critical dimensions of integrated circuit features during fabrication according to the present invention.

FIG. 1A shows a mask 14 having a pattern defining integrated circuit features 18 which are desired to be transferred to a silicon substrate (not shown) as part of the fabrication of the integrated circuit. The mask 14 also contains a geometric structure 16 which is separate and apart from the desired integrated circuit feature 18. The geometric structure 16 comprises a linear series of diamond shapes 20-27 arranged tip-to-tip in a progressively overlapping manner. At one end of the geometric structure 16, diamonds 26 and 27 exhibit separation between their opposing tips 26a and 27a, respectively. Progressing upward in the structure (as oriented in this figure), the amount of separation between opposing tips of the diamonds diminishes, until diamond 23 and 24 meet at their respective tips 23a and 24a. Continuing upward in the structure (as oriented in this figure), the tips of opposing diamonds begin to increasingly overlap, such that between diamonds 22 and 23 a condition of slight overlap exists, between diamonds 21 and 22 there is a layer overlap, and between diamonds 20 and 21 there is yet a larger overlap.

Figure 1B:
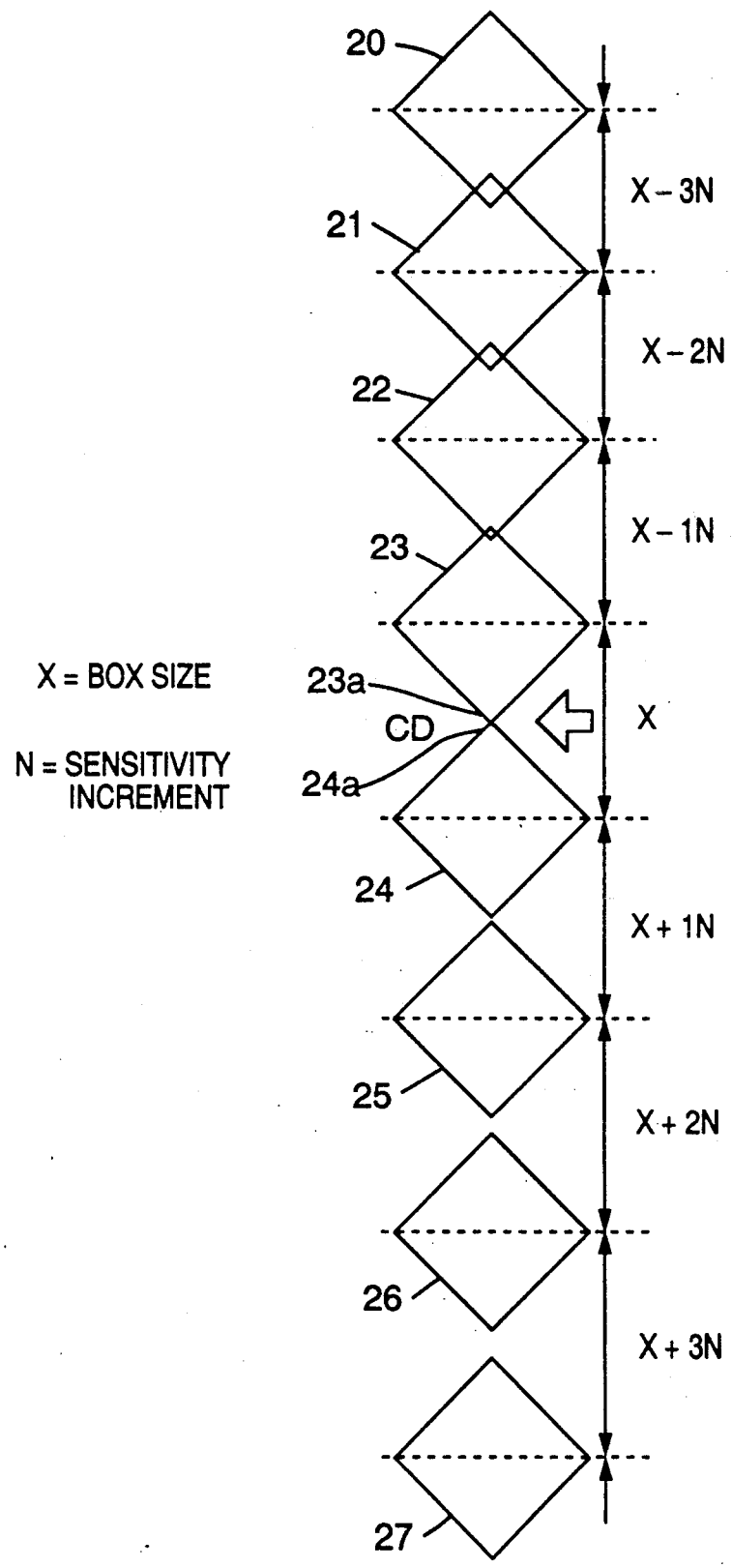

Referring now to FIG. 1B, in the illustrated embodiment, each of the diamonds 20-27 has a diagonal length (tip-to-tip) of 10 microns, represented as X. This size may vary based on size or space constraints. At the center point of the geometric structure 16, i.e., where tips 23a and 24a meet, there is no overlap or separation. However, in either vertical direction, the amount of overlap or separation is incremented by 0.05 microns (this number may vary based on process limitations), represented as N in the figure. Thus, there is a 0.05 micron separation (X+1N) between diamonds 24 and 25, a 0.10 micron separation (X+2N) between diamonds 25 and 26, and a 0.15 micron separation (X+3N) between diamonds 26 and 27. Likewise, there is a 0.05 micron overlap (X−1N) of diamonds 23 and 22, a 0.10 micron overlap (X−2N) of diamonds 22 and 21, and a 0.15 micron overlap (X−3N) of diamonds 21 and 20.

Referring now to FIGS. 2A-2C, as the mask pattern is transferred to the photoresist layer by any of the conventional optical exposure techniques, the size of the diamonds 20-27 in the geometric structure 16 as transferred on the substrate will indicate the degree of exposure. The longer the exposure time, the smaller the diamonds 20-27 become. Thus, proper exposure can be determined when the size of the diamonds 20-27 is such that diamonds 23 and 24 meet at their opposing tips 23a and 24a, as indicated in FIG. 2B by arrow 30. If the pattern is underexposed, as in FIG. 2A, the diamonds 20-27 would be larger. Thus, diamonds 23 and 24 would not meet at tips 23a and 24a, but would overlap, and the point where the tips of two diamonds meet would be located downward in the structure (as oriented in this figure), in this case at tips 25a and 26a. If the pattern is overexposed, as in FIG. 2C, the diamonds 20-27 would be smaller. Thus, tips 23a and 24a would not touch and there would be a separation therebetween. The point where two diamonds meet would thus be located upward in the structure (as oriented in this figure), in this case at tips 22a and 23a.

It is to be noted that the geometric structure 16 provides critical dimension information in one direction only. With reference to the x-y axis 29 of FIG. 1, the orientation of the geometric structure 16 provides y-direction resolution. A similar structure could be added to the mask and oriented in the x-direction to provide full dimensional accuracy.

Figure 3:
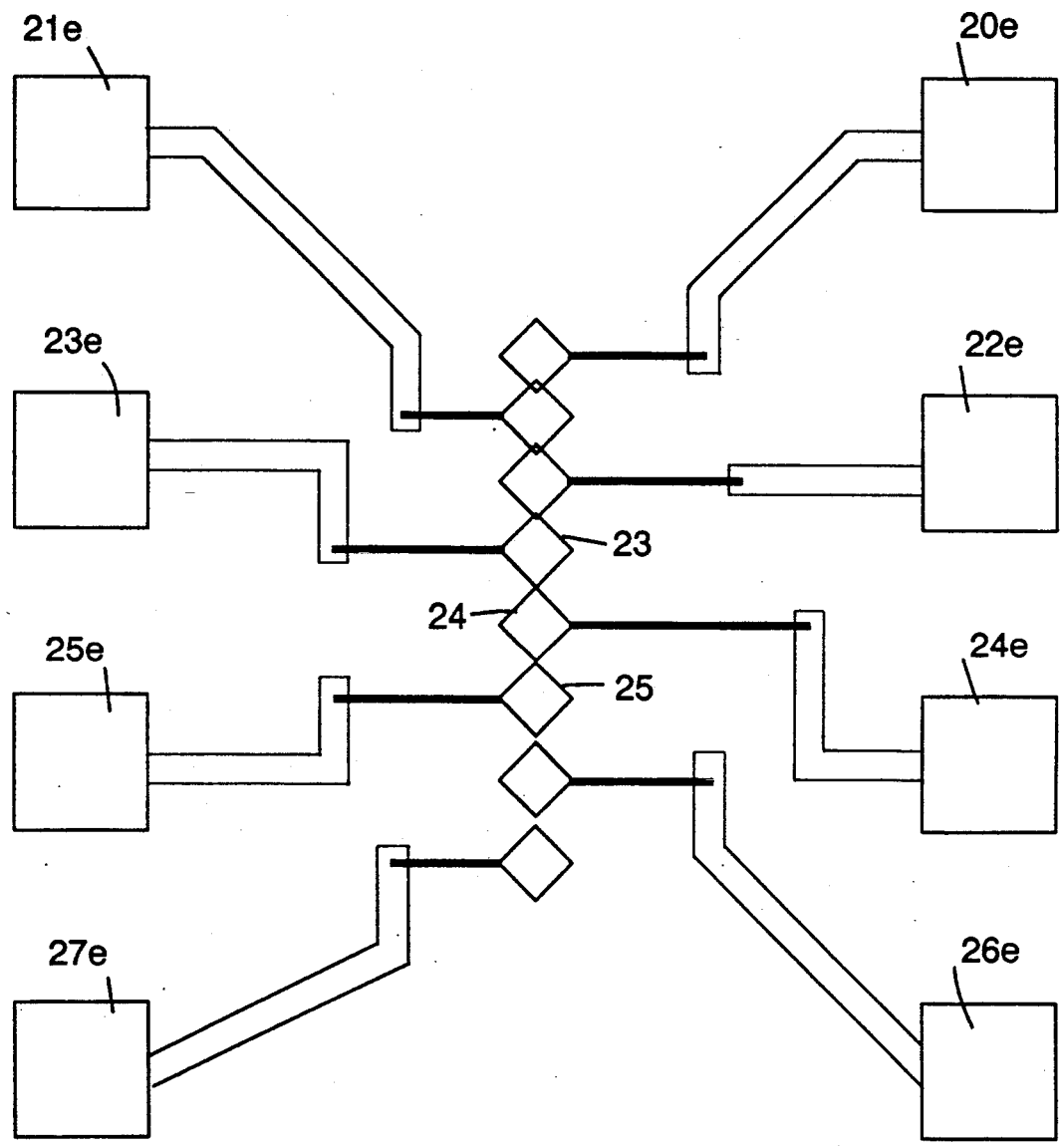
FIG. 3 shows an electrically conductive version of FIG. 1 having a voltage source applied to one end of the structure.

In the alternative embodiment of FIG. 3 (not shown to scale), the geometric structure 16 is exposed in the resist and etched into a conductive underlying film (not shown). Leads 20e-27e are attached to each diamond 20-27 on the film surface. A voltage +V is applied via lead 20e to diamond 20. Each succeeding diamond, i.e., diamond 21, then diamond 22, etc., is probed to determine whether there is a current flow. So long as the diamonds are in contact with each other, there will be a current flow. At the point where no current is measured, i.e. diamond 25, there is a separation between the current diamond (25) and the previous one (24). Thus, opposing tips must have met between the previous pair of diamonds (23 and 24).

In another alternative embodiment, illustrated in FIGS. 4A and 4B, registration of succeeding layers of features may be determined. For each layer, the geometric structure 36 is altered from the basic structure 16 of FIG. 1, in that the non-opposing tips of most diamonds are truncated and offset relative to reference diamond 43, which is unchanged.

All left tips 40a-47a are separated by a 7. distance of 9.95 microns (X−1N). Thus, left tip 42a is not offset since it is already located at a distance of 9.95 microns (X−1N) from the left tip of reference diamond 43. However, tip 41a is offset by 0.05 microns (N) relative to diamond 41 since diamond 41 overlaps diamond 42 by an additional N increment. Similarly, tip 40a is offset by 0.10 microns (2N) relative to diamond 40 since diamond 40 overlaps diamond 41 by an additional N increment. Likewise, tips 44a-47a are offset relative to their respective diamonds to maintain the tip-to-tip separation of X−1N.

In similar fashion, all right tips 40b-47b are separated by a distance of 10 microns (X). Thus, tip 44b is not offset from diamond 44 since it is located at a distance of 10 microns (X) from the right tip of reference diamond 43. However, tip 45b is offset by 0.05 microns (N) relative to diamond 45 since diamond 45 overlaps diamond 44 by an additional N increment. In this manner, tip 46b is offset by a 2N increment relative to diamond 46, and tip 47b is offset by a 3N increment relative to diamond 47. Likewise, tips 40b-42b are offset relative to their respective diamonds to maintain the tip-to-tip separation of X.

Referring now to FIG. 4B, when the first layer of features is fabricated, structure 36 is etched into the underlying film (not shown) and proper exposure may be determined by examining the opposing tips as disclosed above. For the next layer of features, a structure 36', identical to structure 36, is created on the mask in a position which is parallel and abutting structure 36 so that a side-by-side, tip-to-tip orientation of the structures 36 and 36' is obtained upon exposure. The point of perfect registration is obtained at point 49 where reference diamonds 43 and 43' meet at their tips. If the registration is off, the tips of other diamond pairs will meet. For example, a third layer having structure 36'' is off registration, such that the second and third layer meet at tips 40b' and 40a'', indicating a shift in registration of three increments, or 0.15 microns (3N). As mentioned with regard to FIG. 1, the structures just described give dimensional registration information for one direction only. Similar structures could be added in another direction. Also, feature dimension for each layer is still obtained by the method described with reference to FIG. 1.

It should be understood that the invention is not intended to be limited by the specifics of the above-described embodiment, but rather defined by the accompanying claims.

I claim:

1. A method for measuring the proper exposure of a desired circuit feature on an integrated circuit wafer, wherein the method of making the integrated circuit feature comprises forming a layer of photoresist on a surface, creating a mask pattern of the desired circuit feature, transferring the mask pattern to the photoresist layer, exposing the photoresist layer using photochemical means and transferring the pattern to the underlying surface, the method comprising:

including a structure in the mask pattern, apart from the desired circuit feature, wherein the structure comprises a plurality of identical geometric patterns arranged in a progressively overlapping edge-to-edge orientation on the mask pattern, the progressive overlap being such that at one end of the structure, there is a substantial separation between the opposing edges of the geometric patterns, in the middle of the structure the opposing edges of the geometric patterns meet, and at the other end of the structure there is a substantial overlap of the opposing edges of the geometric patterns; and analyzing the degree of exposure of the structure on the photoresist layer, wherein the proper degree of exposure is obtained when the opposing edges of the geometric pattern meet in the middle of the structure, and wherein an underexposed or overexposed condition exists when the point at which the opposing edges meet has shifted from the middle of the structure.

2. A method according to claim 1, wherein the analyzing step comprises microscopic examination of the exposed structure.

3. A method according to claim 1, wherein the geometric patterns are diamond shapes and the edges of the geometric patterns are the tips of the diamonds.

4. A method according to claim 1, wherein the underlying surface is a conductive film layer.

5. A method according to claim 4, wherein the analyzing step comprises applying a voltage to the structure on the conductive film layer at the overlapped end of the geometric pattern and testing each geometric pattern for the presence of current, and wherein the position of the structure a which current no longer is detected represents the point at which the geometric patterns separate, thus defining the degree of exposure of the transferred mask pattern.

6. A method for obtaining proper registration of a plurality of layers of desired circuit features on an exposed integrated circuit wafer, wherein the process of making the integrated circuit features comprises forming a layer of photoresist on a surface, creating a mask pattern of the desired circuit feature, transferring the mask pattern to the photoresist layer, exposing the photoresist layer using photochemical means, transferring the pattern to the underlying surface, and repeating the process for subsequent layers until the desired features have been transferred to the underlying surface, the method comprising:

including a structure in the mask pattern for each layer, apart from the desired circuit feature and parallel with and abutting the previous layer structure, wherein the structure comprises a plurality of geometric patterns arranged in a progressively overlapping edge-to-edge orientation on the mask pattern, the progressive overlap being such that at one end of the structure there is a substantial separation between the opposing edges of the geometric patterns, in the middle of the structure the opposing edges of the geometric patterns meet, and at the other end of the structure there is a substantial overlap of the opposing edges of the geometric patterns, and wherein the non-opposing edges of the geometric patterns are offset relative to a reference pattern in the middle of the structure;

analyzing the degree of exposure of the structure on the layer, wherein the proper degree of exposure is obtained when the opposing edges of each geometric pattern exactly touch in the middle of the structure, and wherein an underexposed or overexposed condition exists when the point at which the opposing edges meet has shifted from the middle of the structure;

analyzing the registration of succeeding layers of features, wherein proper registration is obtained when the abutting non-opposing edges of the exposed parallel structures of each layer meet at the reference pattern, and wherein the nature and degree of off-registration condition may be determined by reference to which abutting, parallel geometric patterns have their offset, non-opposing edges meeting.

7. A method according to claim 6, wherein the each analyzing step comprises microscopic examination of the exposed structure.

8. A method according to claim 6, wherein the geometric patterns are diamonds and each edge is a diamond tip.

9. A method according to claim 8, wherein the diamonds are aligned in a straight line, and wherein the non-opposing tips of each diamond are defined for reference purposes as left and right tips, and wherein the offset comprises locating each left tip at a first distance (X−1N) from each adjacent left tip and locating each right tip at a second distance (X) from each adjacent right tip.

10. A method according to claim 9, wherein the first distance (X) is the diagonal length of the diamond, and wherein the second distance (X−1N) is an increment less than the diagonal length of the diamond.

* * * * *